(12) United States Patent
Bertrams et al.

(10) Patent No.: US 12,406,883 B2
(45) Date of Patent: Sep. 2, 2025

(54) CONTACT HOLE

(71) Applicant: Infineon Technologies Dresden GmbH & Co. KG, Dresden (DE)

(72) Inventors: Thomas Bertrams, Dresden (DE); Maik Stegemann, Pesterwitz (DE); Armin Tilke, Dresden (DE); Sascha Weber, Bannewitz (DE)

(73) Assignee: Infineon Technologies Dresden GmbH & Co. KG, Dresden (DE)

( * ) Notice: Subject to any disclaimer, the term of this patent is extended or adjusted under 35 U.S.C. 154(b) by 1330 days.

(21) Appl. No.: 16/225,423

(22) Filed: Dec. 19, 2018

(65) Prior Publication Data

US 2019/0189509 A1    Jun. 20, 2019

(30) Foreign Application Priority Data

Dec. 20, 2017 (DE) .......................... 102017130683.8

(51) Int. Cl.
   *H01L 21/768* (2006.01)
   *H01L 21/285* (2006.01)
   (Continued)

(52) U.S. Cl.
   CPC .. *H01L 21/76877* (2013.01); *H01L 21/28556* (2013.01); *H01L 21/76843* (2013.01);
   (Continued)

(58) Field of Classification Search
   CPC ........ H01L 23/53266; H01L 21/76877–76883
   See application file for complete search history.

(56) References Cited

U.S. PATENT DOCUMENTS 5,407,861 A * 4/1995 Marangon ......... H01L 21/76838
                                                    257/E21.582
5,580,823 A * 12/1996 Hegde .................. C23C 14/046
                                                    204/192.17
(Continued)

FOREIGN PATENT DOCUMENTS

CN        104143527 A      11/2014
CN        105336671 A       2/2016
(Continued)

*Primary Examiner* — Jarrett J Stark
(74) *Attorney, Agent, or Firm* — Murphy, Bilak & Homiller, PLLC

(57) ABSTRACT

A power semiconductor component includes a power semiconductor partial structure having an insulating layer arranged on an upper side of a semiconductor body. A contact hole arranged on an upper side of the insulating layer proceeds from that side, extending at least partly within the insulating layer. An adhesion promoter layer arranged on an upper side of the power semiconductor partial structure at least partly covers the insulating layer upper side and a surface of the contact hole. A tungsten-comprising layer arranged on the adhesion promoter layer at least partly covers the adhesion promoter layer and has a first thickness in a region of the contact hole and dimensioned such that the tungsten-comprising layer fills the contact hole. The tungsten-comprising layer has a second thickness in the region of the insulating layer upper side which is less than the first thickness. A connection layer is arranged on the tungsten-comprising layer.

31 Claims, 5 Drawing Sheets

(51) Int. Cl.
*H01L 23/532* (2006.01)
*H10D 30/01* (2025.01)
*H10D 64/23* (2025.01)

(52) U.S. Cl.
CPC .. *H01L 21/76853* (2013.01); *H01L 23/53266* (2013.01); *H10D 30/0295* (2025.01); *H10D 64/256* (2025.01)

(56) References Cited

U.S. PATENT DOCUMENTS

| | | | | |
|---|---|---|---|---|
| 5,622,894 A * | 4/1997 | Jang | ................. | H01L 21/76877 257/E21.585 |
| 5,641,710 A * | 6/1997 | Wang | ................ | H01L 21/76843 257/E21.584 |
| 5,670,422 A * | 9/1997 | Tabara | .............. | H01L 21/76843 257/E21.584 |
| 5,700,726 A * | 12/1997 | Huang | ................ | H01L 21/7684 257/E21.583 |
| 5,702,983 A * | 12/1997 | Shinohara | ............. | H01L 23/485 438/628 |
| 5,767,015 A * | 6/1998 | Tabara | ............. | H01L 21/76802 257/E21.577 |
| 5,786,272 A * | 7/1998 | Marangon | ......... | H01L 21/76838 257/E21.583 |
| 5,801,096 A * | 9/1998 | Lee | ................... | H01L 21/32136 257/E21.311 |
| 6,020,267 A * | 2/2000 | Liaw | ................. | H01L 21/76895 257/E21.029 |
| 8,153,520 B1 | 4/2012 | Chandrashekar et al. | | |
| 10,256,142 B2 * | 4/2019 | Chandrashekar | ..... | C23C 16/045 |
| 10,566,211 B2 * | 2/2020 | Chandrashekar | ..... | C23C 16/505 |
| 2003/0082902 A1 * | 5/2003 | Fukui | ............... | H01L 21/76877 438/763 |
| 2005/0247957 A1 * | 11/2005 | Ninomiya | .......... | H01L 29/0634 257/197 |
| 2012/0009785 A1 * | 1/2012 | Chandrashekar | ..... | C23C 16/045 438/669 |

FOREIGN PATENT DOCUMENTS

| | | |
|---|---|---|
| CN | 105448808 A | 3/2016 |
| DE | 102008006919 A1 | 8/2008 |

* cited by examiner

CONTACT HOLE

TECHNICAL FIELD

The present disclosure relates to exemplary embodiments of a power semiconductor component and exemplary embodiments of a method for producing a power semiconductor component. In particular, the present disclosure relates to exemplary embodiments of a power semiconductor component with a contact hole and exemplary embodiments of a corresponding method.

BACKGROUND

Many functions of modern appliances in automotive, consumer and industrial applications, such as converting electrical energy and driving an electric motor or an electric machine, for instance, are based on power semiconductor devices.

By way of example so-called insulated-gate bipolar transistors (IGBTs), metal-oxide semiconductor field-effect transistors (MOSFETs) and diodes, but to name a few, are used for various applications, inter alia for switches in power sources and power converters.

Power semiconductor components are used in various structures, according to the respective use and the requirements placed thereon. Here, various materials and various lithographic techniques are typically used for forming a respective structure.

Some applications consider it advantageous, or demand, one or more contact holes to be provided in an insulating layer within a power semiconductor component, said contact holes being used for electrical contacting of a contact region arranged below the surface of the insulating layer. Here, the interest in an embodiment that saves as much space as possible on the one hand and the requirement of high contacting and manufacturing quality on the other hand sometimes present mutually opposing conditions.

SUMMARY

Aspects of the present description relate to power semiconductor component technology.

According to one exemplary embodiment, a power semiconductor component comprises a power semiconductor partial structure comprising a semiconductor body and an insulating layer, which is arranged on an upper side of the semiconductor body, wherein at least one contact hole is arranged on an upper side of the insulating layer, said contact hole, proceeding from the upper side of the insulating layer, extending at least partly within the insulating layer and being provided for electrical contacting of a contact region below the upper side of the insulating layer. Further, the power semiconductor component comprises an adhesion promoter layer, which is arranged on an upper side of the power semiconductor partial structure and which at least partly covers the upper side of the insulating layer and a surface of the contact hole; a tungsten-comprising layer, which is arranged on the adhesion promoter layer and at least partly covers the adhesion promoter layer and which has a first thickness in the region of the contact hole, said thickness being dimensioned in such a way that the tungsten-comprising layer fills the contact hole, and which has a second thickness in the region of the upper side of the insulating layer, said second thickness being less than the first thickness, and a connection layer, which is arranged on the tungsten-comprising layer.

According to a further exemplary embodiment, a power semiconductor component comprises a power semiconductor partial structure comprising a semiconductor body and an insulating layer, which is arranged on an upper side of the semiconductor body, wherein at least one contact hole is arranged on an upper side of the insulating layer, said contact hole, proceeding from the upper side of the insulating layer, extending at least partly within the insulating layer and being provided for electrical contacting of a contact region below the upper side of the insulating layer. Further, the power semiconductor component comprises an adhesion promoter layer, which is arranged on an upper side of the power semiconductor partial structure and which at least partly covers the upper side of the insulating layer and a surface of the contact hole; a tungsten-comprising layer, which is arranged on the adhesion promoter layer and at least partly covers the adhesion promoter layer and which has a first thickness in the region of the contact hole and which has a second thickness in the region of the upper side of the insulating layer, said second thickness being less than the first thickness, wherein the first thickness corresponds to at least half of the diameter of the contact hole, and a connection layer, which is arranged on the tungsten-comprising layer.

According to a further exemplary embodiment, a method for producing a power semiconductor component includes providing a power semiconductor partial structure comprising a semiconductor body and an insulating layer, which is arranged on an upper side of the semiconductor body, wherein at least one contact hole is arranged on an upper side of the insulating layer, said contact hole, proceeding from the upper side of the insulating layer, extending at least partly within the insulating layer and being provided for electrical contacting of a contact region below the upper side of the insulating layer. The method further includes applying an adhesion promoter layer to an upper side of the power semiconductor partial structure in such a way that the adhesion promoter layer at least partly covers the upper side of the insulating layer and a surface of the contact hole; applying a tungsten-comprising layer to the adhesion promoter layer in such a way that the tungsten-comprising layer at least partly covers the adhesion promoter layer and has a first thickness which is dimensioned in such a way that the tungsten-comprising layer fills the contact hole; removing part of the tungsten-comprising layer in the region of the upper side of the insulating layer in such a way that, after the removal, the tungsten-comprising layer has a second thickness in the region of the upper side of the insulating layer, said second thickness being less than the first thickness, and applying a connection layer to the tungsten-comprising layer.

According to a further exemplary embodiment, a method for producing a power semiconductor component includes providing a power semiconductor partial structure comprising a semiconductor body and an insulating layer, which is arranged on an upper side of the semiconductor body, wherein at least one contact hole is arranged on an upper side of the insulating layer, said contact hole, proceeding from the upper side of the insulating layer, extending at least partly within the insulating layer and being provided for electrical contacting of a contact region below the upper side of the insulating layer. The method further includes applying an adhesion promoter layer to an upper side of the power semiconductor partial structure in such a way that the adhesion promoter layer at least partly covers the upper side of the insulating layer and a surface of the contact hole; applying a tungsten-comprising layer to the adhesion promoter layer in such a way that the tungsten-comprising layer at least partly covers the adhesion promoter layer and has a first thickness, wherein the first thickness corresponds to at least half of the diameter of the contact hole; removing part of the tungsten-comprising layer in the region of the upper side of the insulating layer in such a way that, after the removal, the tungsten-comprising layer has a second thickness in the region of the upper side of the insulating layer, said second thickness being less than the first thickness, and applying a connection layer to the tungsten-comprising layer.

Additional features and advantages will become clear from the following detailed description and the drawings.

BRIEF DESCRIPTION OF THE DRAWINGS

Elements in the drawings are not necessarily illustrated with uniform scale. What is important, instead, is the illustration of principles of the invention. Moreover, reference signs in the drawings may denote corresponding elements. In the figures.

DETAILED DESCRIPTION

Figure 1A:
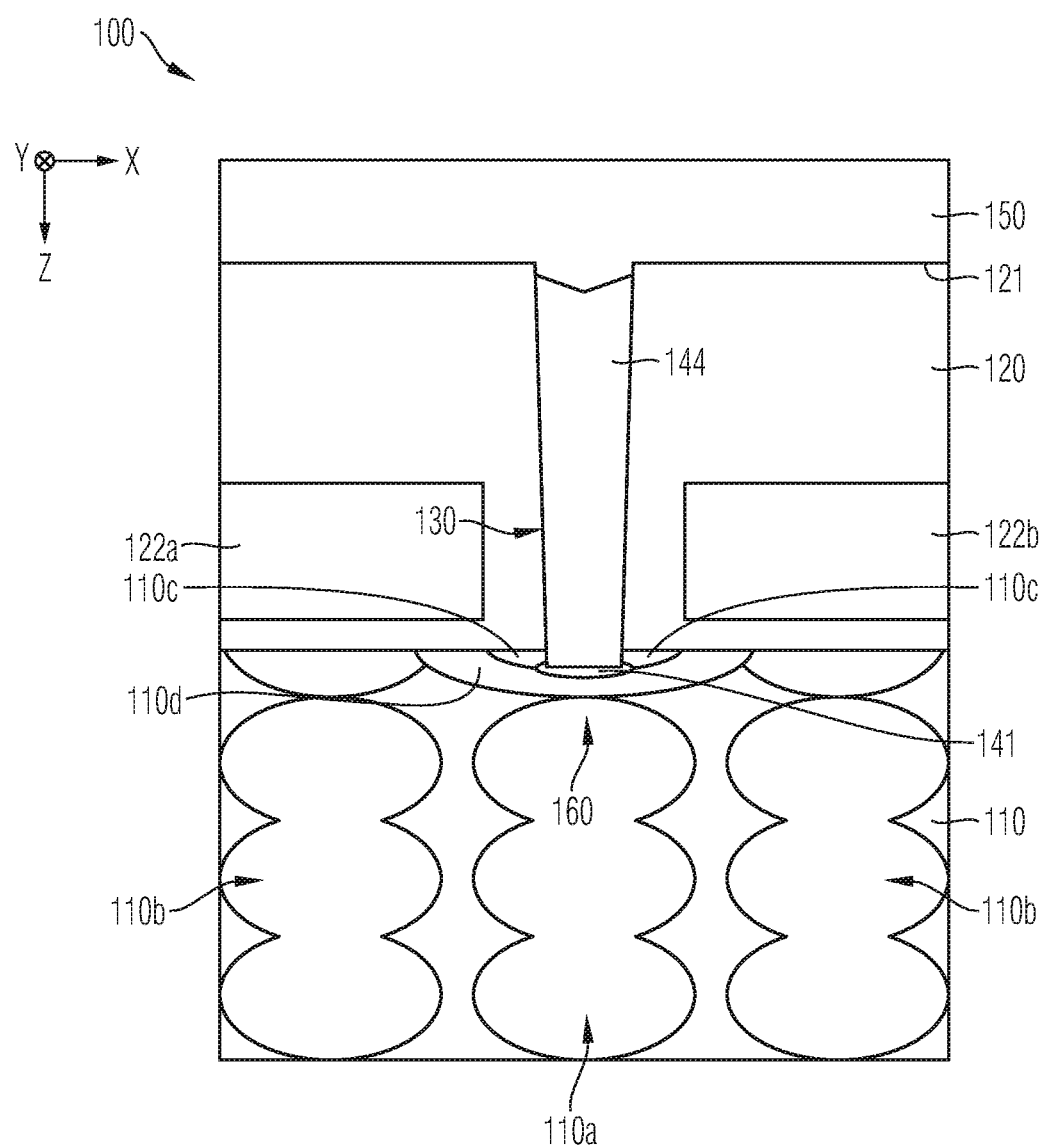
FIG. 1A shows a schematic and exemplary illustration of a power semiconductor component.

In the following detailed description, reference is made to the drawings, which form part of the present disclosure and which show certain exemplary embodiments, according to which the invention can be implemented, for elucidation purposes.

In this context, expressions relating to direction, such as, for example, "upper side", "lower side", "underneath", "front side", "behind", "back", "directed forwards", "rearward", "below", "above", etc., may be used with reference to an alignment of the described drawings. Because parts of exemplary embodiments may be positioned in various alignments, the terminology relating to direction is used for elucidation purposes and is in no way limiting. It is understood that it is possible to use other exemplary embodiments and make structural or logical changes, without departing from the scope of the present invention. Therefore, the following detailed description should not be understood in a limiting sense and the scope of the present invention is defined by the attached claims.

Detailed reference is made below to various exemplary embodiments, of which one or more examples are elucidated in the drawings. Each example is presented for elucidation purposes and should not be understood to delimit the invention. By way of example, features presented or described as part of one exemplary embodiment can be used in—or in conjunction with—other exemplary embodiments in order to yield a further exemplary embodiment. The intention is that the present invention also contains such modifications and developments. The examples are described using specific language that should not be construed as limiting the scope of the claims. The drawings are not to scale and only serve elucidation purposes. For improved clarity, identical elements or production steps are indicated by identical reference signs in the various drawings, provided nothing else is stated.

The term "horizontal", as used in the present description, is intended to describe an alignment that is substantially parallel to a horizontal surface of a semiconductor substrate or a semiconductor structure. By way of example, this may be the surface of a semiconductor wafer or semiconductor chip. By way of example, the (first) lateral direction X and the (second) lateral direction Y, as mentioned below, could be horizontal directions, wherein the first lateral direction X and the second lateral direction Y may be perpendicular to one another.

The term "vertical", as used in the present description, is intended to describe an alignment that is arranged substantially perpendicular to the horizontal surface, i.e., parallel to the normal direction of the surface of the semiconductor wafer/semiconductor chip. By way of example, the direction of extent Z, as mentioned below, could be a direction of extent that is perpendicular to both the first lateral direction X and the second lateral direction Y.

In the context of the present description, the expressions "in electrical contact" and "electrically connected" are intended to describe that a low-resistance electrical connection or low-resistance current path is present between two regions, sections, zones, portions or parts of the presently described apparatus. Moreover, in the context of the present description, the expression "in contact" is intended to describe that a direct physical connection is present between two elements of the respective semiconductor device; by way of example, a transition between two elements that are in contact with one another cannot contain a further interposed element or the like.

Further, in the context of the present description and provided nothing else is specified, the expression "electrical insulation" is intended to be used in the context of its generally valid interpretation and, accordingly, it is intended to describe that two or more components are positioned separately from one another and that no ohmic connection connecting these components is present. Nevertheless, components that are electrically insulated from one another may be coupled to one another, for example mechanically coupled and/or capacitively coupled and/or inductively coupled. So as to provide an example, two electrodes of a capacitor can be electrically insulated from one another and, at the same time, be coupled to one another in mechanical and capacitive fashion, for example by means of an insulator, for example by means of a dielectric.

Special exemplary embodiments, which are described in the present description, relate to a power semiconductor component, e.g., a power semiconductor component that can be used within a power converter or a power source, without being limited thereto. In one exemplary embodiment, such a component can be embodied accordingly to carry a load current that should be supplied to a load and/or that is provided accordingly by means of a power source. By way of example, the power semiconductor component can comprise one or more active power semiconductor cells, such as, for instance, a monolithically integrated diode cell and/or a monolithically integrated transistor cell and/or a monolithically integrated IGBT cell and/or a monolithically integrated RC-IGBT cell and/or a monolithically integrated MOS gated diode cell, (MGD) cell, and/or a monolithically integrated MOSFET cell and/or developments thereof. A plurality of such diode cells and/or transistor cells may be integrated in the component.

The expression "power semiconductor component", as used in the present description, is intended to denote a single component with great voltage blocking and/or current carrying suitability. Expressed differently: such a power semiconductor component is provided for high currents, typically in the Ampere range, e.g., up to 5 or 100 A, and/or voltages, typically above 15 V, particularly typically up to 40 V or more, e.g., up to at least 500 V or more than 500 V, e.g. at least 600 V.

By way of example, the power semiconductor component described below can be a component that is embodied to be used as a power component in a low-voltage, mid-voltage and/or high-voltage application. By way of example, the expression "power semiconductor component", as used in the present description, is not directed to logic semiconductor components, which are used, for example, for storing data, for processing data and/or for other types of semiconductor-based data processing.

FIG. 1A shows a schematic illustration of a section of a cross-sectional view of a power semiconductor component 100. The power semiconductor component 100 comprises a semiconductor body 110 and an insulating layer 120 with an upper side 121, said insulating layer being arranged above the semiconductor body 110. Proceeding from the upper side 121 of the insulating layer 120, a contact hole 130 extends within the insulating layer 120. The contact hole 130 facilitates electrical contacting of a contact region 160 that is situated below the surface 121 of the insulating layer 120 from above the insulating layer 120. By way of example, the semiconductor body 110 and the insulating layer 120 are parts of a power semiconductor partial structure of the power semiconductor component 100.

Moreover, the power semiconductor component 100 comprises a plug 144 which at least substantially fills the contact hole 130. In the shown example, the plug 144 is made of tungsten, which was applied to the power semiconductor partial structure 110, 120 by means of sputtering and which was subsequently removed again from regions of the upper side 121 away from the contact hole 130, for example by etching or chemical-mechanical polishing. A contact layer 141 is arranged between the contact region 160 and the plug 144. The plug 144 and the contact layer 141 serve for electrical contacting of the semiconductor body 110 in the contact region 160. By way of example, the depth of the contact hole 130 is 1.5 µm. Moreover, the contact hole 130 has a wedge-shaped cross-sectional profile in the shown example. Here, a smallest diameter of the contact hole 130 is situated in the vicinity of the contact region 160 and is 700 nm, for example.

Moreover, the power semiconductor component 100 comprises a connection layer 150. The connection layer 150 is provided as an electrode of the power semiconductor component 100 and it comprises aluminum and/or copper, for example. As a result of the described structure of the power semiconductor component 100, electrical contacting of the contact region 160 below the upper side 121 of the insulating layer 120 is facilitated by way of the connection layer 150 and by means of the plug 144 and the contact layer 141.

In the shown example, the power semiconductor component 100 is a transistor, e.g., a MOSFET with a compensation structure. For the purposes of embodying the compensation structure, the semiconductor body 110 has various columns 110a, 110b with different doping, for example with p-doping in first columns 110a and n-doping in second columns 110b. Here, the columns 110b form drift regions of the power semiconductor component 100, for example. Moreover, a plurality of planar control electrodes 122a, 122b are arranged within the insulating layer 120, said control electrodes being electrically insulated from the connection layer 150 and being able to be impinged by a control signal, e.g., a gate signal, by way of an independent electric contact (not illustrated).

A pn-isolation, which is embodied by an n-source region 110c that is isolated from the remaining part of the semiconductor body 110 by a p-body region 110d and which is typical for MOSFETs, is situated in the contact region 160. Both the p-body region 110d and the n-source region 110c are in electrical contact with the plug 144. The control electrodes 122a, 122b are embodied to induce an inversion channel in the p-body region 110d (which is also known as a "channel region") in order thereby to put the power semiconductor component 100 into a conductive state.

One of the first columns 110a adjoins the p-body region 110d. It is known that the n-column 110b and the p-body region 110d form a body diode of the power semiconductor component 100.

In some examples, a plurality of contact holes 130 are arranged in accordance with a matrix arrangement or any other pattern, for example another periodic pattern, in the power semiconductor partial structure 110, 120. Here, control electrodes 122a, 122b are in each case arranged between adjacent contact holes 130 within the insulating layer 120. Moreover, one or more contact holes 130 have a trench-shaped embodiment for the purposes of forming a trench electrode in several examples. The cross-sectional view shown in FIG. 1A in this case corresponds to a view of an XZ-plane of the power semiconductor component 100, for example, whereas the contact hole 130 extends in trench-shaped fashion in the Y-direction of the power semiconductor component 100.

Figure 1B:
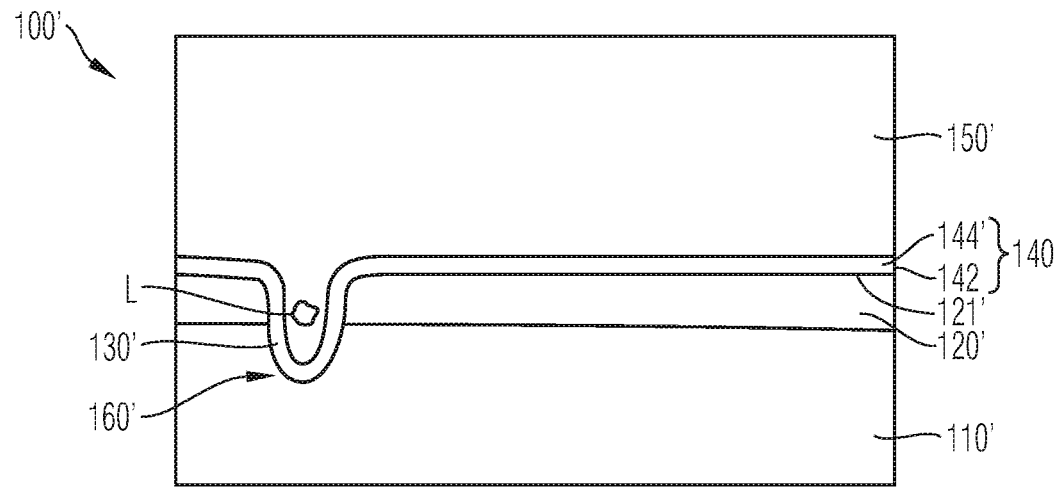
FIG. 1B shows a schematic and exemplary illustration of a further power semiconductor component.

FIG. 1B shows a schematic illustration of a section of a cross-sectional view of a further power semiconductor component 100'. Similar to the power semiconductor component 100 from FIG. 1A, the power semiconductor component 100' comprises a semiconductor component 110' and an insulating layer 120' with an upper side 121' arranged above the semiconductor body 110'. Moreover, proceeding from the upper side 121' of the insulating layer 120', a contact hole 130' also extends within the insulating layer 120' in the power semiconductor component 100' for the purposes of electrically contacting a contact region 160' situated below the upper side 121' of the insulating layer 120' from above the insulating layer 120' by way of a connection layer 150' serving as an electrode. By way of example, the semiconductor body 110' and the insulating layer 120' are parts of a power semiconductor partial structure of the power semiconductor component 100'.

Deviating from the example of FIG. 1A, the power semiconductor component 100' comprises an adhesion promoter layer 142 arranged on an upper side 121' of the insulating layer 120' and a tungsten-comprising layer 144' arranged on the adhesion promoter layer 142. The adhesion promoter layer 142 and the tungsten-comprising layer 144' form a layer composite 140 that electrically contacts the semiconductor body 110' in the contact region 160'. In the shown example, the layer composite 140 covers both the upper side 121' of the insulating layer 120' and a surface of the contact hole 130'. Moreover, both the adhesion promoter layer 142 and the tungsten-comprising layer 144', and also the layer composite 140 overall, have an at least substantially homogeneous thickness, both in the region of the upper side 121' of the insulating layer 120' and in the region of the contact hole 130'.

By way of example, the adhesion promoter layer 142 comprises titanium and/or titanium nitride. Moreover, the tungsten-comprising layer 144' consists at least largely of tungsten in the shown example. By way of example, the layer composite 140 has a thickness in the range of 200 nm-300 nm.

The adhesion promoter layer 142 promotes an adhesive connection between the power semiconductor partial structure 110', 120' and the tungsten-comprising layer 144'. The tungsten-comprising layer 144' promotes electrical contacting of the contact region 160'. For instance, an exemplary depth of the contact hole 130' is 1 μm-1.5 μm and the smallest diameter of the contact hole 130' varies from approximately 500 nm in a lower region of the contact hole to approximately 700 nm in an upper region of the contact hole 130', for example. In the case of such profiles, tungsten penetrates in a more conform fashion into the contact holes 130' and also exhibits a more conform deposition behavior than aluminum or copper, for example, which are preferably usable for the connection layer 150'. Moreover, the layer composite 140 inhibits outward diffusion of possible doping from the power semiconductor partial structure 110', 120'. Titanium present in the adhesion promoter layer 142, in particular, is effective as a diffusion barrier.

By way of example, the application of the adhesion promoter layer 142, the tungsten-comprising layer 144' and the connection layer 150' is implemented in successive steps, for instance by means of sputtering or chemical vapor deposition in each case. Moreover, in this context, the tungsten-comprising layer 144' offers protection for the more sensitive adhesion promoter layer 142 against unwanted ablation of the adhesion promoter layer 142 by certain processing steps in the production process of the power semiconductor component 100'.

In contrast to the example of FIG. 1A, the contact hole 130' in the power semiconductor component 100' is substantially filled with material of the connection layer 150'. While aluminum and/or copper are preferably used for the connection layer 150', cavities, so-called voids, often form within the contact hole 130' on account of the deposition behavior of these materials, as illustrated in FIG. 1B by the cavity L. Disadvantages may arise therefrom, for example if process gases or other chemical residues are included in the cavity L; this may subsequently adversely affect the functionality or service life of the power semiconductor component 100'. Moreover, a cavity L may collapse uncontrollably still during the further application of the connection layer 150' and thus have an irregular application of the connection layer 150' as a consequence. In some cases, a cavity L moreover leads to the formation of a so-called pinhole during the further application of the connection layer 150', i.e., to a hollow channel extending through the connection layer 150' proceeding from the cavity L.

Figure 2:
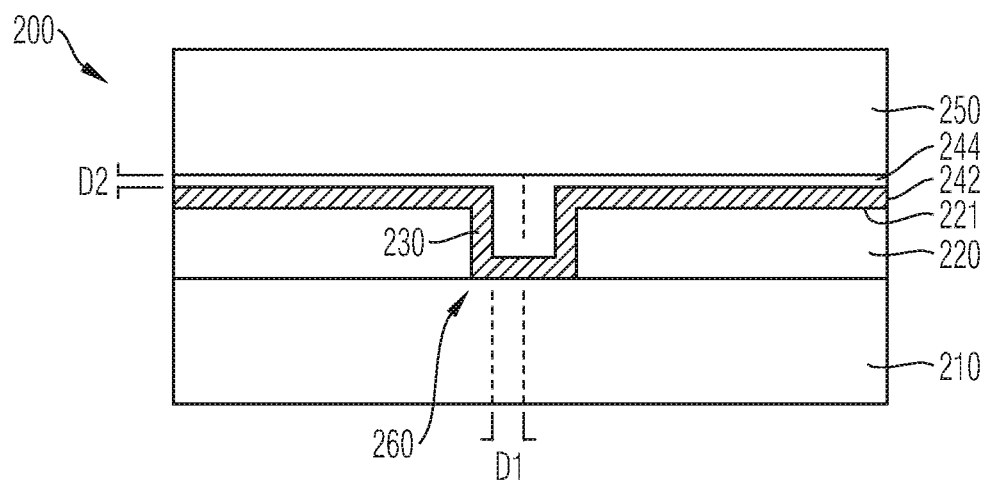
FIG. 2 shows a schematic and exemplary illustration of a power semiconductor component according to one or more exemplary embodiments.

FIG. 2 shows a schematic illustration of a cross-sectional view of a power semiconductor component 200 according to one exemplary embodiment. The power semiconductor component 200 likewise comprises a semiconductor body 210, an insulating layer 220, an adhesion promoter layer 242 arranged on an upper side 221 of the insulating layer 220, a tungsten-comprising layer 244 arranged on the adhesion promoter layer 242 and a connection layer 250 arranged on the tungsten-comprising layer 244. Further, the power semiconductor component 200 also has a contact hole 230, which extends at least partly within the insulating layer 220 for the purposes of electrically contacting a contact region 260 below the upper side 221 of the insulating layer 220. Provided nothing else emerges from the following explanations, what was stated in the context of the power semiconductor component 100' of FIG. 1 applies accordingly in respect of the power semiconductor element 200 and the aforementioned features.

In the shown example, the contact hole 230 extends up to the upper side of the semiconductor body 210, while the contact region 260 is also situated on the upper side of the semiconductor body 210. By contrast, in other examples, the contact hole 230 extends into the semiconductor body 210, in a manner similar to the example of FIG. 1A. Here, the contact region 260 is also situated within the semiconductor body 210, for example. In further examples, the contact hole 230 extends within the insulating layer 220 without reaching the semiconductor body 210 and the contact region 260 is also situated above the semiconductor body 210. Here, the contact hole 230 is provided, for example, for the purposes of contacting electrical components arranged within the insulating layer 220, such as control electrodes, for example.

In contrast to the example of FIG. 1, the tungsten-comprising layer 244 in the power semiconductor component 200 does not have a uniform thickness in the region of the upper side 221 of the insulating layer 220 and in the region of the contact hole 230. Instead, in the region of the contact hole 230, the tungsten-comprising layer 244 has a first thickness D1 in relation to a surface of the contact hole 260 on which the tungsten-comprising layer 244 is applied, said first thickness being dimensioned in such a way that the tungsten-comprising layer 244 at least substantially fills the contact hole 260.

In the shown example, the thickness D1 is dimensioned in such a way that the contact hole 260 is completely filled. By contrast, in other examples, the thickness D1 is dimensioned in such a way that the tungsten-comprising layer 244 largely fills, but does not completely fill, the contact hole 260. By way of example, the contact hole 260 does not have a perpendicular lateral or side face as illustrated schematically in FIG. 2 in this case; instead it has an at least partly wedge-shaped cross-sectional profile, for example. In these cases, the thickness D1 corresponds to at least half of the diameter of the contact hole 230, as averaged over the depth of the contact hole 230, for example. The diameter at a respective depth is determined, for example, in the tightest direction of extent of the contact hole 230 in each case, i.e., according to a smallest diameter at the respective depth. The diameter averaged over the depth of the contact hole 230 is moreover determined according to an arithmetic or geometric mean, for example. By way of example, in the case of the thickness D1 of the tungsten-comprising layer determined thus, a conical contact hole 230 or a trench-shaped contact hole 230 with a wedge-shaped cross-sectional layer is also at least largely filled by the tungsten-comprising layer 244.

At least largely filling the contact hole 230 by means of the tungsten-comprising layer 244, as described above, promotes the formation of an electrical connection between the connection layer 250 and the contact region 260. At the same time, this avoids possible difficulties that may arise if an interior of the contact hole 230 is intended to be filled by means of the connection layer 250, as described in conjunction with FIG. 1. This promotes, in particular, the use of aluminum and/or copper as constituent parts of the connection layer 250, which have a disadvantageous, less conformal deposition behavior for filling the contact hole 230' than tungsten in the case of conventional deposition processes and preferred dimensions of the contact hole 230, as described in conjunction with FIGS. 1A and 1B.

By contrast, in the region of the upper side 221 of the insulating layer 220, the tungsten-comprising layer 244 has a second thickness D2, which is less than the first thickness D1. A lower thickness D2 of the tungsten-comprising layer 244 on the upper side 221 of the insulating layer 220 is suitable for avoiding excessive mechanical stresses in the power semiconductor component 200 as a result of the tungsten-comprising layer 244. This is advantageous, particularly in the case of power semiconductor components 200 that have a comparatively large upper side 221. At the same time, the thickness D2 of the tungsten-comprising layer 244 is dimensioned in such a way in certain examples that the tungsten-comprising layer 244 offers sufficient protection to the adhesion promotion layer 242, lying therebelow, in relation to subsequent production steps, for example in relation to subsequent etching processes.

In some examples, the first thickness D1 lies in the range of 300 nm-600 nm, for example in the range of 400 nm-500 nm. Moreover, the second thickness D2 lies in the range of 100 nm-300 nm in some examples, for example in the range of 150 nm-250 nm. By contrast, the adhesion promoter layer 242 is less than 100 nm in some examples.

Moreover, the insulating layer 220 comprises borophosphosilicate glass, BPSG, in some examples. In further examples, the insulating layer 220 comprises silicon nitride and/or undoped oxide, for example in combination with BPSG.

FIGS. 3A-3E show schematic illustrations of various manufacturing stages during the production of a power semiconductor component 200 as described in conjunction with FIG. 2.

Figure 3A:
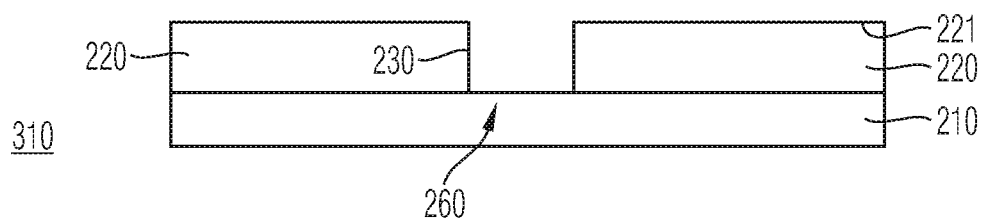
FIGS. 3A-3E show schematic and exemplary illustrations of different stages of manufacture during the production of a power semiconductor component according to one or more exemplary embodiments.

FIG. 3A shows a power semiconductor partial structure comprising a semiconductor body 210 and an insulating layer 220 applied thereon (manufacturing stage 310). Here, a contact hole 230 for contacting the contact region 260 has already been formed in the insulating layer 220. By way of example, conventional coating, masking and/or ablation techniques can be used for producing the power semiconductor partial structure 210, 220.

Figure 3B:
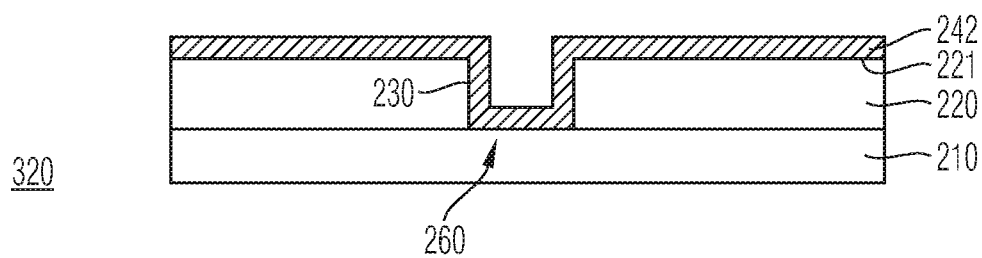

FIG. 3B shows the power semiconductor partial structure 210, 220 after applying the adhesion promoter layer 242 (manufacturing stage 320). The adhesion promoter layer 242 is formed by depositing, for example sputtering, titanium and/or titanium nitride.

Figure 3C:
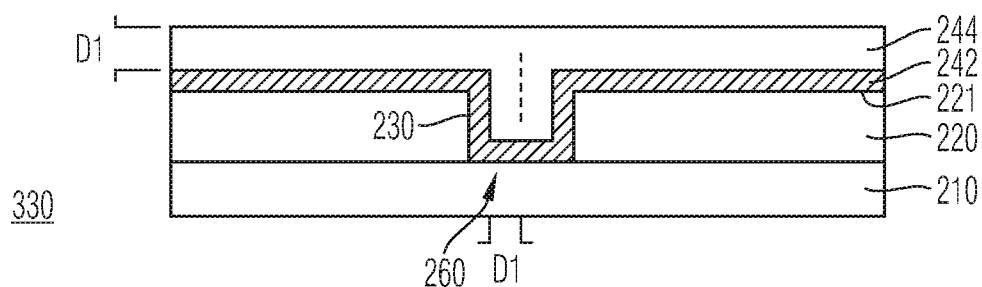

FIG. 3C shows a subsequent manufacturing stage 330 after the tungsten-comprising layer 244 with a thickness D1, as described above, has been applied to the adhesion promoter layer 242. The tungsten-comprising layer 244 is likewise formed by depositing, for example sputtering, tungsten. The chosen thickness D1 ensures that the contact hole 230 is at least substantially filled by the tungsten-comprising layer 244.

Figure 3D:
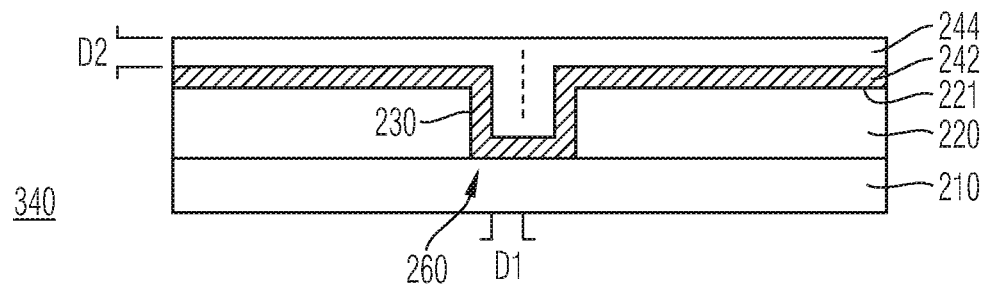

FIG. 3D shows the structure from FIG. 3C, wherein the tungsten-comprising layer 244 has been partly removed again from outside of the contact hole 230 (manufacturing stage 340). The tungsten-comprising layer 244 has been ablated, for example by chemical-mechanical polishing, CMP, and/or etching back, to such an extent that it has a thickness D2, as described above, in the region of the upper side 221 of the insulating layer 220.

Figure 3E:
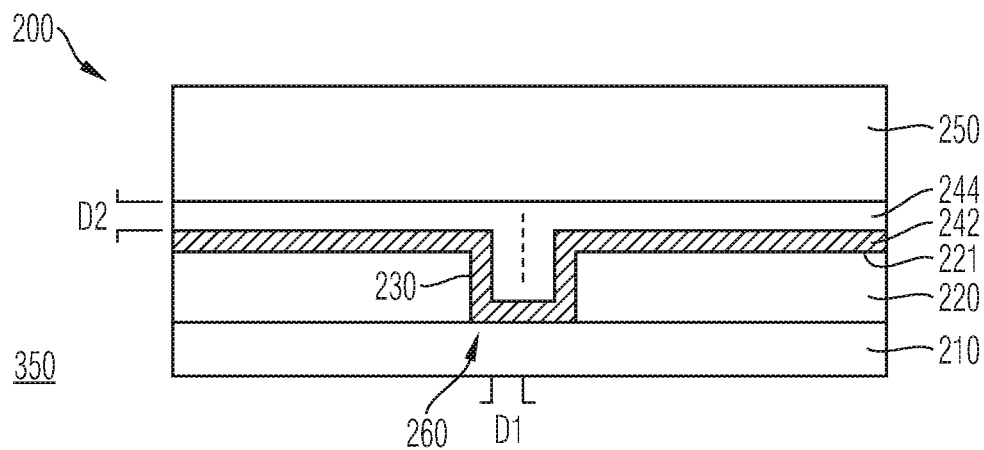

FIG. 3E shows the power semiconductor component 200 after applying the connection layer 250 to the tungsten-comprising layer 244 (manufacturing stage 350). The connection layer 250 has been formed by depositing, e.g., sputtering, aluminum and/or copper.

Figure 4:
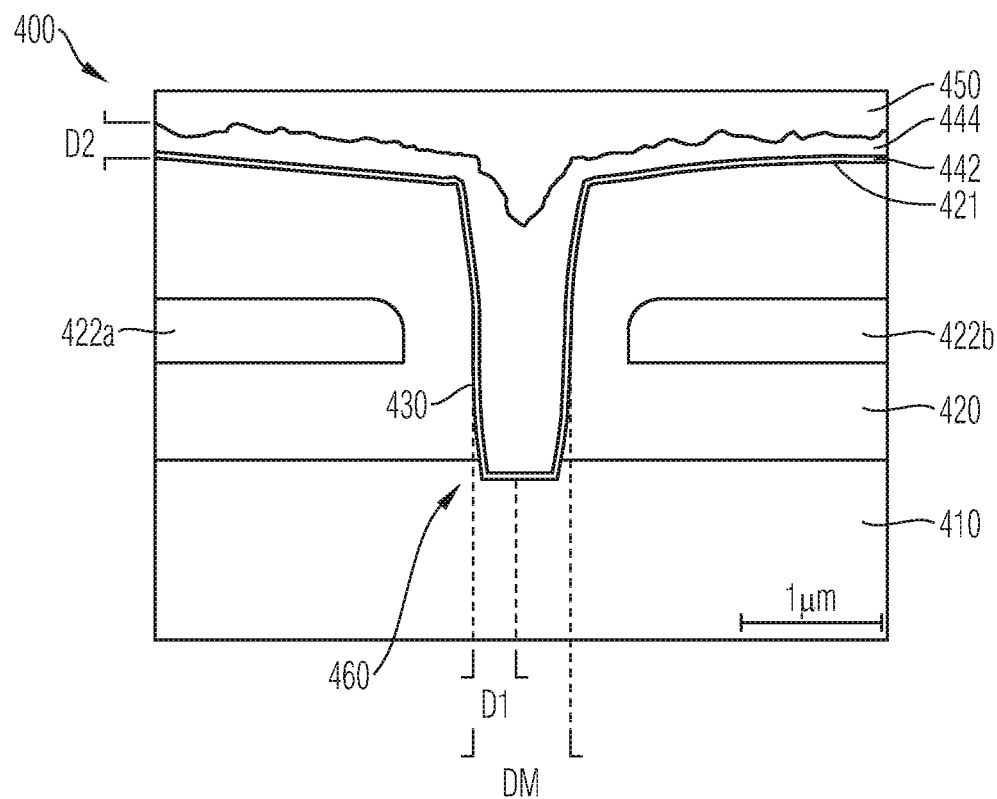
FIG. 4 shows a schematic and exemplary illustration of a power semiconductor component according to one or more further exemplary embodiments.

FIG. 4 shows a schematic illustration of a section of a cross-sectional view of a power semiconductor component 400 according to a further exemplary embodiment. The power semiconductor component 400 comprises a semiconductor body 410 and an insulating layer 420 arranged thereon as constituent parts of a power semiconductor partial structure. Moreover, an adhesion promoter layer 442 is also arranged on an upper side of the power semiconductor partial structure 410, 420 in the case of the power semiconductor component 400, a tungsten-comprising layer 444 and a connection layer 450 in turn being arranged on said adhesion promoter layer. Moreover, the power semiconductor element 400 also comprises a contact hole 430 for electrically contacting a contact region 460 below the upper side 421 of the insulating layer 420. The tungsten-comprising layer 444 has a first thickness D1 in the region of the contact hole 430 and a second thickness D2, which is less than the first thickness D1, in the region of the upper side 421 of the insulating layer 420. Provided nothing else emerges from the following explanations, what was stated in the context of FIG. 2 applies accordingly in respect of the power semiconductor element 400 and the aforementioned features. In particular, the thickness D1 is at least half a mean diameter DM of the contact hole 430. This ensures that the tungsten-comprising layer 444 at least substantially fills the contact hole 430.

Like in the example of FIG. 1A, the power semiconductor component 400 can be a MOSFET, for example a MOSFET with a compensation structure. The power semiconductor component 400 likewise comprises a plurality of planar control electrodes 422a, 422b in this case, said planar control electrodes being arranged within the insulating layer 420. Here, the control electrodes 422a, 422b are arranged on different sides of the contact hole 430 and serve, for example, to form an inversion channel in a body region (not illustrated in FIG. 4) of the semiconductor body 410.

In contrast to the example of FIG. 2, the contact hole 430 in the power semiconductor element 400 is embodied with an irregular, in particular partly angled, cross-sectional profile. Here, the first thickness D1 is chosen in such a way that it corresponds to approximately half a mean diameter of the contact hole 430. Here, a widening of the contact hole 430 in the upper region has as a consequence that the tungsten-comprising layer 444 largely fills the contact hole 430, albeit not completely. However, according to what was said above, it is understood that, even in the case of the power semiconductor component 400, possible difficulties, which may arise when filling the contact hole 430 substantially by means of the connection layer 450, are effectively avoided.

Figure 5:
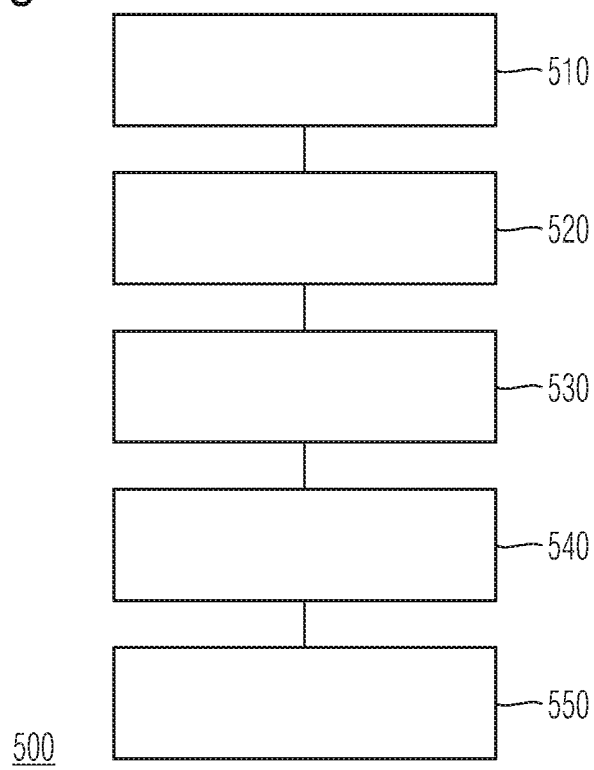
FIG. 5 shows a flowchart of a method for producing a power semiconductor component according to one or more exemplary embodiments.

FIG. 5 shows a flowchart of a method 500 for producing a power semiconductor component, for example the power semiconductor components 200, 400 as described in conjunction with FIGS. 2 to 4. In some examples, steps of the method 500 are suitable for producing manufacturing steps 310-350, as described in conjunction with FIGS. 3A to 3E.

The method 500 includes providing a power semiconductor partial structure (step 510). Here, this is a power semiconductor partial structure as described in conjunction with FIGS. 2 to 4, for example.

Further, the method 500 includes applying an adhesion promoter layer to an upper side of the power semiconductor partial structure (step 520). Here, the adhesion promoter layer is applied in such a way that it at least partly covers the upper side of an insulating layer of the power semiconductor partial structure. In some examples, the adhesion promoter layer comprises titanium and/or titanium nitride. Here, the adhesion promoter layer is applied by means of sputtering, for example. In further examples, the adhesion promoter layer is applied at least in part by means of chemical vapor deposition.

The method 500 further includes applying a tungsten-comprising layer on the adhesion promoter layer in such a way that the tungsten-comprising laser at least partly covers the adhesion promoter layer (step 530). Moreover, applying the tungsten-comprising layer is implemented in such a way that the tungsten-comprising layer has a first thickness D1, for example on the entire upper side of the semiconductor partial structure, said thickness being dimensioned in such a way that the tungsten-comprising layer fills the contact hole of the power semiconductor partial structure. As an alternative thereto, the tungsten-comprising layer largely fills the contact hole of the power semiconductor partial structure, albeit not completely, in further examples. By way of example, the first thickness D1 corresponds to at least half of the diameter of the contact hole, for example a smallest diameter of the contact hole averaged over the depth of the contact hole.

In some examples, the tungsten-comprising layer consists at least substantially of tungsten. Moreover, the tungsten-comprising layer is applied by means of chemical vapor deposition in some examples. In further examples, the tungsten-comprising layer is applied at least in part by means of sputtering.

Further, the method 500 includes removing part of the tungsten-comprising layer in a region of the upper side of the insulating layer of the power semiconductor partial structure (step 540). By way of example, the removal is implemented by means of back etching and/or chemical-mechanical polishing, CMP. Moreover, removal is implemented in such a way that, after the removal, the tungsten-comprising layer has a second thickness D2 in the region of the upper side of the insulating layer, said second thickness being less than the first thickness D1.

Removing the part of the tungsten-comprising layer, step 540, in the region of the upper side of the insulating layer is implemented without a removal of part of the tungsten-comprising layer within the contact hole in some examples.

Further, the method 500 includes applying a connection layer to the tungsten-comprising layer (step 550). By way of example, the connection layer comprises copper and/or aluminum. In some examples, the connection layer is applied at least partly by means of deposition, for example by means of sputtering or chemical vapor deposition.

Spatially relative terms such as "under", "below", "lower", "on", "above" and the like, are used for ease of description to explain the positioning of one element relative to a second element. These terms are intended to encompass different orientations of the respective device in addition to different orientations than those depicted in the figures. Moreover, terms such as "first", "second", and the like, are used to describe various elements, regions, sections, etc. and are also not intended to be limiting. Like terms refer to like elements throughout the description.

The terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor component, comprising:
   a power semiconductor partial structure comprising a semiconductor body and an insulating layer arranged on an upper side of the semiconductor body;
   a contact hole arranged on an upper side of the insulating layer, the contact hole, proceeding from the upper side of the insulating layer, extending at least partly within the insulating layer and configured for electrical contacting of a contact region below the upper side of the insulating layer;
   an adhesion promoter layer arranged on an upper side of the power semiconductor partial structure and at least partly covering the upper side of the insulating layer and a surface of the contact hole;
   a tungsten-comprising layer arranged on the adhesion promoter layer and at least partly covering the adhesion promoter layer, the tungsten-comprising layer having a first part in the contact hole and a second part outside the contact hole, the second part being partly removed such that the first part has a first thickness in a region of the contact hole and the second part has a second thickness in a region of the upper side of the insulating layer, the first thickness being dimensioned such that the tungsten-comprising layer fills the contact hole, the second thickness being less than the first thickness; and
   a connection layer arranged on the tungsten-comprising layer,
   wherein the first thickness is a horizontal measurement of the first part of the tungsten-comprising layer between a vertical centerline of the contact hole and the adhesion promoter layer,
   wherein the second thickness is a vertical measurement of the second part of the tungsten-comprising layer between an upper side of the adhesion promoter layer and a lower side of the connection layer.

2. The power semiconductor component of claim 1, wherein the adhesion promoter layer comprises at least one of titanium and titanium nitride.

3. The power semiconductor component of claim 1, wherein the tungsten-comprising layer consists of tungsten.

4. The power semiconductor component of claim 1, when the connection layer comprises at least one of copper and aluminum.

5. The power semiconductor component of claim 1, wherein a thickness of the adhesion promoter layer is less than 100 nanometers.

6. The power semiconductor component of claim 1, wherein the first thickness of the tungsten-comprising layer is between 400 and 600 nanometers.

7. The power semiconductor component of claim 1, wherein the second thickness of the tungsten-comprising layer is between 100 and 400 nanometers.

8. The power semiconductor component of claim 1, wherein the insulating layer comprises silicon nitride, undoped oxide and/or borophosphosilicate glass (BPSG) in a region of the upper side of the insulating layer and/or a region of the surface of the contact hole.

9. The power semiconductor component of claim 1, wherein the contact hole comprises a contact trench for forming a trench electrode.

10. The power semiconductor component of claim 1, when the contact region is arranged below the insulating layer.

11. The power semiconductor component of claim 10, wherein the contact region is a region of the semiconductor body and the contact hole is provided for electrical contacting of the semiconductor body.

12. The power semiconductor component of claim 10, wherein the insulating layer comprises a plurality of control electrodes arranged in the insulating layer, and wherein the contact hole extends between adjacent control electrodes of the plurality of control electrodes.

13. The power semiconductor component of claim 1, wherein the insulating layer comprises a control electrode arranged in the insulating layer.

14. The power semiconductor component of claim 1, wherein the power semiconductor component comprises a transistor with a body diode.

15. A power semiconductor component, comprising:
a power semiconductor partial structure comprising a semiconductor body and an insulating layer arranged on an upper side of the semiconductor body;
a contact hole arranged on an upper side of the insulating layer, the contact hole, proceeding from the upper side of the insulating layer, extending at least partly within the insulating layer and being configured for electrical contacting of a contact region below the upper side of the insulating layer;
an adhesion promoter layer arranged on an upper side of the power semiconductor partial structure and at least partly covering the upper side of the insulating layer and a surface of the contact hole;
a tungsten-comprising layer arranged on the adhesion promoter layer and at least partly covering the adhesion promoter layer, the tungsten-comprising layer having a first part in the contact hole and a second part outside the contact hole, the second part being partly removed such that the first part has a first thickness in a region of the contact hole and the second part has a second thickness in a region of the upper side of the insulating layer, the second thickness being less than the first thickness, the first thickness corresponding to at least half of a diameter of the contact hole; and
a connection layer arranged on the tungsten-comprising layer,
wherein the first thickness is a horizontal measurement of the first part of the tungsten-comprising layer between a vertical centerline of the contact hole and the adhesion promoter layer,
wherein the second thickness is a vertical measurement of the second part of the tungsten-comprising layer between an upper side of the adhesion promoter layer and a lower side of the connection layer.

16. The power semiconductor component of claim 15, wherein the diameter of the contact hole is a smallest diameter of the contact hole averaged over a depth of the contact hole.

17. The power semiconductor component of claim 15, wherein the adhesion promoter layer comprises at least one of titanium and titanium nitride.

18. The power semiconductor component of claim 15, wherein the tungsten-comprising layer consists of tungsten.

19. The power semiconductor component of claim 15, when the connection layer comprises at least one of copper and aluminum.

20. The power semiconductor component of claim 15, wherein a thickness of the adhesion promoter layer is less than 100 nanometers.

21. The power semiconductor component of claim 15, wherein the first thickness of the tungsten-comprising layer is between 400 and 600 nanometers.

22. The power semiconductor component of claim 15, wherein the second thickness of the tungsten-comprising layer is between 100 and 400 nanometers.

23. The power semiconductor component of claim 15, wherein the insulating layer comprises silicon nitride, undoped oxide and/or borophosphosilicate glass (BPSG) in a region of the upper side of the insulating layer and/or a region of the surface of the contact hole.

24. The power semiconductor component of claim 15, wherein the contact hole comprises a contact trench for forming a trench electrode.

25. The power semiconductor component of claim 15, when the contact region is arranged below the insulating layer.

26. The power semiconductor component of claim 25, wherein the contact region is a region of the semiconductor body and the contact hole is provided for electrical contacting of the semiconductor body.

27. The power semiconductor component of claim 25, wherein the insulating layer comprises a plurality of control electrodes arranged in the insulating layer, and wherein the contact hole extends between adjacent control electrodes of the plurality of control electrodes.

28. The power semiconductor component of claim 15, wherein the insulating layer comprises a control electrode arranged in the insulating layer.

29. The power semiconductor component of claim 15, wherein the power semiconductor component comprises a transistor with a body diode.

30. The power semiconductor component of claim 1, wherein the first thickness lies in a range of 300 to 600 nanometers and the second thickness lies in a range of 100 to 300 nanometers.

31. The power semiconductor component of claim 15, wherein the first thickness lies in a range of 300 to 600 nanometers and the second thickness lies in a range of 100 to 300 nanometers.

* * * * *